(12) United States Patent
Hemmer et al.

(10) Patent No.: US 10,961,449 B2
(45) Date of Patent: Mar. 30, 2021

(54) ENGINEERED FLUORESCENT NANODIAMOND

(71) Applicants: The Texas A&M University System, College Station, TX (US); Carnegie Institution of Washington, Washington, DC (US)

(72) Inventors: Philip Hemmer, College Station, TX (US); Todd Zapata, Washington, DC (US); Viktor Struzhkin, Poolesville, MD (US); Yingwei Fei, Potomac, MD (US)

(73) Assignees: The Texas A&M University System, College Station, TX (US); Carnegie Institution of Washington, Washington, DC (US)

( * ) Notice: Subject to any disclaimer, the term of this patent is extended or adjusted under 35 U.S.C. 154(b) by 81 days.

(21) Appl. No.: 15/486,097

(22) Filed: Apr. 12, 2017

(65) Prior Publication Data

US 2017/0292069 A1    Oct. 12, 2017

Related U.S. Application Data

(60) Provisional application No. 62/321,728, filed on Apr. 12, 2016.

(51) Int. Cl.
    *C09K 11/65*     (2006.01)
    *C30B 29/04*     (2006.01)
    (Continued)

(52) U.S. Cl.
    CPC ............ *C09K 11/65* (2013.01); *B01J 3/062* (2013.01); *B01J 3/067* (2013.01); *C01B 32/25* (2017.08);
    (Continued)

(58) Field of Classification Search
    None
    See application file for complete search history.

(56) References Cited

U.S. PATENT DOCUMENTS

| | | | | |
|---|---|---|---|---|
| 4,483,836 A | * | 11/1984 | Adadurov | B01J 3/08 423/290 |
| 5,304,342 A | * | 4/1994 | Hall, Jr. | B01J 3/062 419/11 |

(Continued)

OTHER PUBLICATIONS

Kamiyama et al.; Fluorescent SiC and Its Application to White Light-Emitting Diodes; Journal of Semiconductors; vol. 32, No. 1; Jan. 2011.*

(Continued)

*Primary Examiner* — Guinever S Gregorio
(74) *Attorney, Agent, or Firm* — Winstead PC (57) ABSTRACT

Nanodiamonds are grown under conditions where diamond-like organic seed molecules do not decompose. This permits engineered growth of fluorescent nanodiamonds wherein a custom designed seed molecule can be incorporated at the center of a nanodiamond. By substituting atoms at particular locations in the seed molecule it is possible to achieve complex multi-atom diamond color centers or even to engineer complete quantum registers. In addition, it is possible to grow ultra-small nanodiamonds, wherein each nanodiamond, no matter how small, can have at least one bright and photostable fluorescent emitter.

7 Claims, 7 Drawing Sheets

(51) Int. Cl.
*B01J 3/06* (2006.01)
*C01B 32/25* (2017.01)
*C01B 32/26* (2017.01)

(52) U.S. Cl.
CPC .............. *C01B 32/26* (2017.08); *C30B 29/04* (2013.01); *B01J 2203/0655* (2013.01); *B01J 2203/0695* (2013.01); *C01P 2002/90* (2013.01); *C01P 2004/64* (2013.01); *C01P 2006/60* (2013.01)

(56) References Cited

U.S. PATENT DOCUMENTS

| | | | | |
|---|---|---|---|---|
| 5,882,786 | A * | 3/1999 | Nassau | A44C 17/00 427/249.8 |
| 2010/0254884 | A1* | 10/2010 | Shenderova | B82Y 5/00 423/446 |
| 2013/0336873 | A1* | 12/2013 | Ishiwata | C30B 25/18 423/446 |

OTHER PUBLICATIONS

Stauss et al. Diamondoid Synthesis in Atmospheric Pressure Adamantane-Argon-Methane-Hydrogen Mixtures Using a Continuous Flow Plasma Microreactor; Plasma Sources Sci. Technol.; 23, 035016(7pp) 2014.*

Mass Production and Dynamic Imaging of Fluorescent Nanodiamonds; Nature Nanotechnology; vol. 3 May 2008.*

Ishiwata et al.; Fluorescent Nanodiamonds from Molecular Diamond Seed; OSA Publishing; 2015.*

* cited by examiner

ENGINEERED FLUORESCENT NANODIAMOND

CROSS-REFERENCE TO RELATED APPLICATIONS

This application claims the benefit of priority to and incorporates by reference the entire disclosure of U.S. Provisional Patent Application No. 62/321,728 filed on Apr. 12, 2016.

STATEMENT REGARDING FEDERALLY SPONSORED RESEARCH OR DEVELOPMENT

This invention was made with Government support under Grant No. 1202258 awarded by the National Science Foundation and Contract No. HHSN268201500010C awarded by the National Institutes of Health. The Government has certain rights in the invention.

BACKGROUND OF THE INVENTION

From the beginning of artificial diamond growth, nanodiamonds were grown from organic compounds. However, due to the emphasis on growing large diamonds, this early work was largely forgotten. Recently, the emergence of certain fluorescent color centers in diamonds has rekindled interest because of the need for better control over nanodiamond properties. For example, ultra-small high-quality nanodiamonds with nitrogen-vacancy (NV) centers are needed for future nanoscale magnetic sensing applications. In addition, more deterministic growth techniques are needed to fabricate large quantities of ultra-small nanodiamonds with near-unity yield of stable fluorescent emitters like the silicon-vacancy (SiV) or nickel-nitrogen centers. Unfortunately the high pressure high temperature (HPHT) growth of nanodiamonds starting from organic material has always required temperatures that were so high that the initial molecules were completely decomposed before the onset of diamond growth. This makes a bottom-up engineering approach to fluorescent nanodiamond fabrication impractical.

SUMMARY OF THE INVENTION

To overcome the problems discussed above, diamond-growth temperature has been dramatically lowered to below the decomposition temperature of organic seed molecules. Under these conditions nanodiamonds have been successfully grown in the range of 2-10 nm or larger depending on growth conditions. In addition, this concept has been extended to include the use of chemically modified diamondoid seed molecules to grow nanodiamonds with particular fluorescent color centers, excluding other color centers that would ordinarily grow from the starting mixture.

In some embodiments, nanodiamonds are grown under conditions where diamond-like organic seed molecules do not decompose. This is a key first step toward engineered growth of fluorescent nanodiamonds wherein a custom designed seed molecule can be incorporated at the center of a nanodiamond. By substituting atoms at particular locations in the seed molecule it is possible to achieve complex multi-atom diamond color centers or even to engineer complete quantum registers, based for example on the nitrogen-vacancy (NV). It is also possible to grow ultra-small nanodiamonds, wherein each diamond no matter how small can have at least one bright and photostable fluorescent emitter.

In some embodiments, a fluorescent nanodiamond is disclosed. The nanodiamond is grown directly from a seed molecule without decomposition of the seed. To provide the reactive carbon atoms needed for diamond growth, a second organic molecule is used that has a lower decomposition temperature than that of the seed molecule. In some embodiments, the organic seed molecule may be chemically modified before nanodiamond growth to grow nanodiamonds with a particular fluorescent color center.

A method for producing fluorescent nanodiamonds includes synthesizing an organic seed molecule containing one or more diamond lattice units, adding the organic seed molecule to a growth mixture and into a diamond anvil cell (DAC) or multi-anvil press or belt press or other high pressure press that is capable of growing diamond. The growth mixture also contains a source of reactive carbon, such as radicals, allowing the reactive carbon to grow diamond around the organic seed molecule.

DESCRIPTION

Various embodiments of the present invention will now be described more fully with reference to the accompanying drawings. The invention may, however, be embodied in many different forms and should not be construed as limited to the embodiments set forth herein.

Embodiments of the invention are directed towards a nanodiamond, wherein the nanodiamond is grown directly from an organic seed molecule that does not result in appreciable decomposition of the starting organic seed material. Decomposition of the organic seed material is controlled by lowering a diamond-growth temperature to a value below a decomposition temperature of the organic seed molecule. In certain embodiments of the invention, use of chemically modified diamondoid seed molecules may be used to grow nanodiamonds with particular fluorescent color centers. In further embodiments of the invention, a multi-atom color center may be produced. In certain embodiments, the chemical composition of the encapsulating diamond may be different than the seed molecule.

In certain embodiments, the various different color centers of nanodiamonds may be utilized to form a quantum register, such as, but not limited to, Carbon 13 nuclear storage registers, precisely coupled to an optical-spin interface comprising a single nitrogen-vacancy (NV) center encapsulated by chemically and isotopically pure 12C diamond.

Figure 1A:
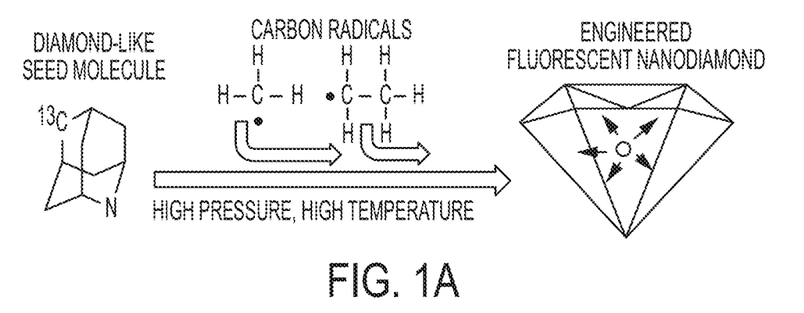
FIG. 1A illustrates an engineered florescent nanodiamond.
Figure 1B:
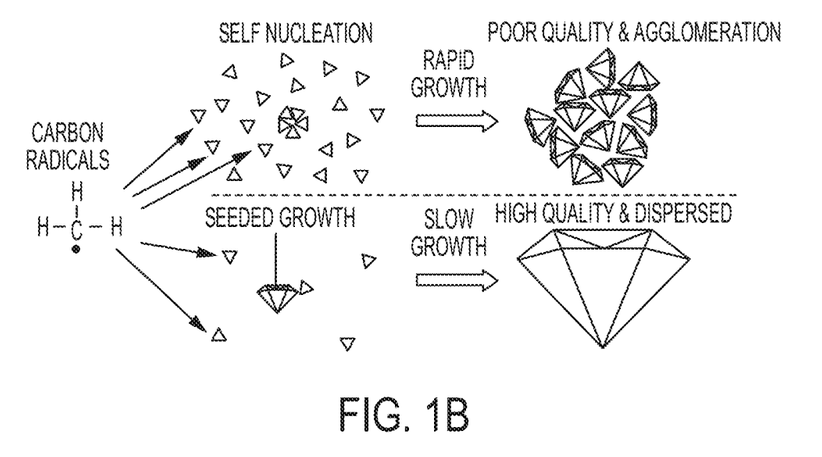
FIG. 1B compares unseeded (top) vs seeded (bottom) nanodiamond growth from organic precursors.

FIGS. 1A and 1B illustrate the basic concept of engineered fluorescent nanodiamonds via molecule seeded growth. FIG. 1A shows a diamond-like seed molecule that has specific atoms arranged in the approximate locations needed to form some color center of interest (the example shown is aza-adamantane with a 13C carbon that could be a precursor for a nitrogen-vacancy quantum register). Reactive carbon (like the methyl and ethyl radicals shown) are then created by cracking a hydrocarbon that decomposes at a much lower temperature than the diamondoid seed molecule. At low concentrations (below the self-nucleation threshold) the carbon radicals should add one at a time to the seed molecule to slowly grow high-quality diamond around the seed. Methyl and ethyl carbon radicals are shown in FIG. 1A because these are the dominant radicals present during plasma-based chemical vapor deposition (CVD) growth, but at high pressure other reactive carbon species, like halogenated carbon compounds may also be used. The subsequent growth of a diamond around the seed molecule gives a near-deterministic number and placement of the desired color center and also assures at least one fluorescent emitter per nanodiamond no matter how small.

FIG. 1B (top) illustrates conventional nanodiamond growth from decomposed organic precursors relying on self-nucleation. For this to occur, the concentration of carbon radicals must be high enough that multiple radicals spontaneously nucleate with a high probability. However, once nucleation has occurred, the high radical concentration leads to subsequent rapid growth which tends to produce lower quality diamond. In contrast, for seeded growth illustrated in FIG. 1B (bottom) the reactive carbon (in this case radical) concentration for seeded growth can be kept much lower so that diamond growth is more controlled and therefore higher crystal quality and higher chemical purity are expected.

Figure 2A:
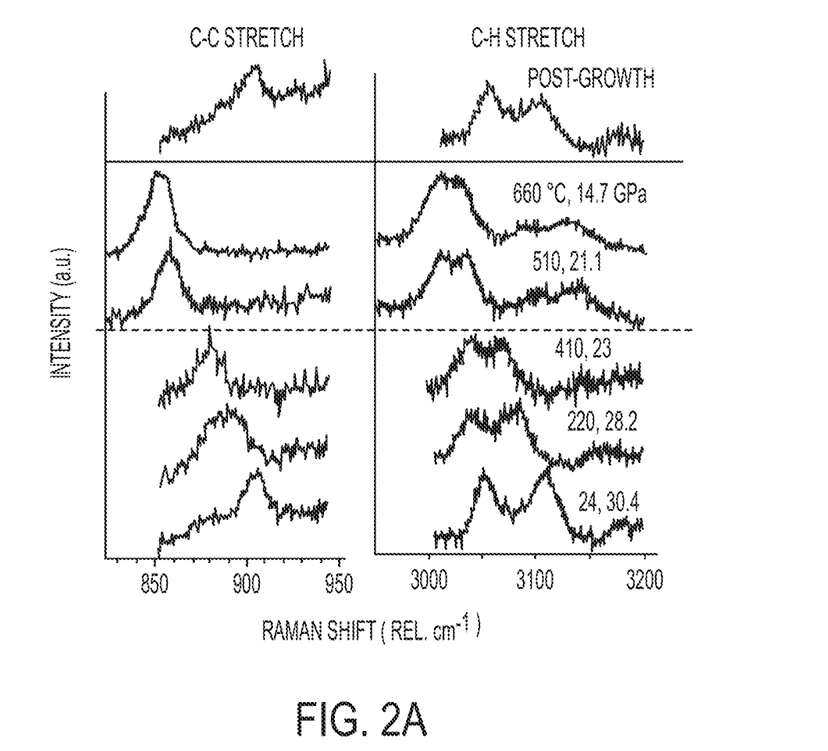
FIG. 2A is a graph with Raman spectra of a seed molecule illustrating that it does not appreciably decompose during diamond growth.
Figure 2B:
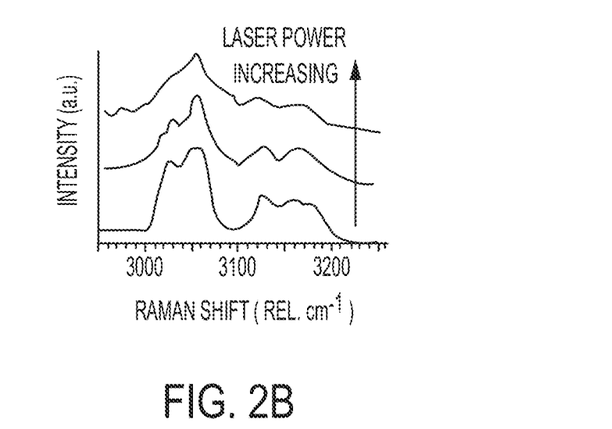
FIG. 2B is a counter-example graph illustrating changes in the Raman spectra that indicate decomposition of the seed. The Raman spectra of a seed molecule show clear distortion as the diamond growth temperature is raised beyond the decomposition temperature of the seed.

FIGS. 2A and 2B illustrate that diamond can grow under conditions where the organic seed molecule does not appreciably decompose. Depicted in FIG. 2A is an adamantane-only growth run in an oven-heated DAC design of FIG. 4. Raman spectra were taken during growth at the temperatures and pressures indicated. The Raman spectra showed no significant adamantane decomposition. As the temperature increased, both C—C and C—H stretch frequencies gradually decreased by an amount that was consistent with the decreasing pressure. Above 410° C. (indicated by the horizontal dashed line in FIG. 2A) there was a shift toward smaller wavenumbers for both spectra, which suggests that the adamantane has undergone a transformation. The transformation is likely a phase transition since, once the growth run is completed and the temperature and pressure are restored to their initial values, both bands return to their initial positions and line widths (post-growth spectra above the solid line in FIG. 2A).

FIG. 2B is a counter example graph of Raman spectra that illustrates a much higher temperature growth run where the seed molecule was destroyed during growth, as evidenced by the significant distortion of the Raman C—H band. Laser heating was employed to reach the higher temperatures needed for decomposition. Such spectral distortions are common when decomposition is taking place. In addition, white flashes were seen at the highest growth temperatures, which is further evidence of decomposition. Unfortunately the actual temperature could not be measured by the thermal imaging apparatus because it was below the minimum detectable temperature of 1,200° C.

Figure 3A:
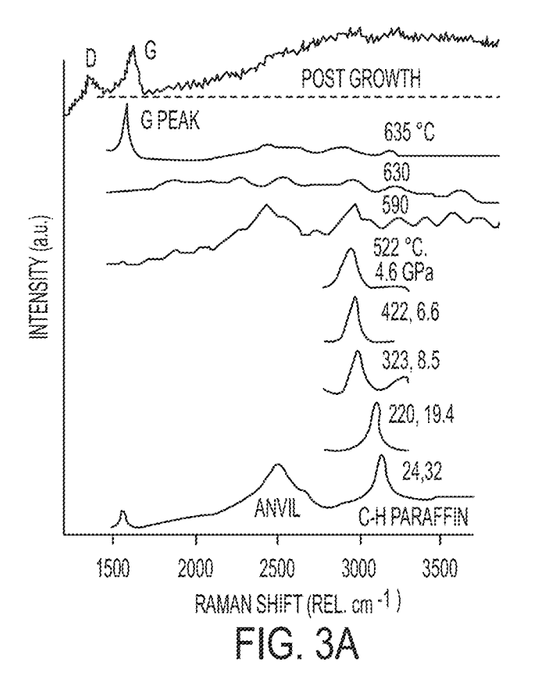
FIG. 3A is a graph illustrating Raman spectra during the growth of nanodiamonds from paraffin with adamantane seeds. Only the C—H stretch of paraffin is owing to its relatively high concentration, and this disappears with increasing temperature due to decomposition of the paraffin, while simultaneously D and G peak appear which signal the growth of nano-carbon compounds, including diamond.

Having established that nanodiamonds can grow under conditions where diamondoid seed molecules remain stable, the next step is to lower the growth temperature even further by growing from a mixture of diamond-like seeds plus an easily cracked source of reactive carbon. This is demonstrated in FIG. 3A using paraffin (Sigma-Aldrich) as a source of reactive carbon and adamantane as seed molecules. FIG. 3A is a graph of Raman spectra during the growth of nanodiamonds from paraffin with adamantane seeds. Temperatures and pressures are as indicated. Only the C—H stretch is visible for the paraffin. The pressure begins to drop as soon as the mixture is heated, which suggests that the paraffin is being consumed. TEM imaging taken after the sample was extracted from the anvil cell so that the D-peak (disordered carbon) was no longer obscured by the anvil showed graphitic rods growing from the metal gasket as soon as the mixture was heated above ~100° C. The top spectrum in FIG. 3A shows post-growth. Significantly, control experiments involving growth from paraffin with and without diamondoid seeds showed that no D or G peaks (graphite) were observed without seed molecules below 600° C. In fact, no solid product (except the graphitic rods) is observed at all after anneal unless diamondoid seeds are present in the growth mixture. Above 600° C., D and G peaks are observed but no diamond is found in the product. TEM imaging of nanodiamond found in the product of paraffin growth seeded with modified diamondoid molecules revealed Nanocrystal graphite.

Figure 3B:
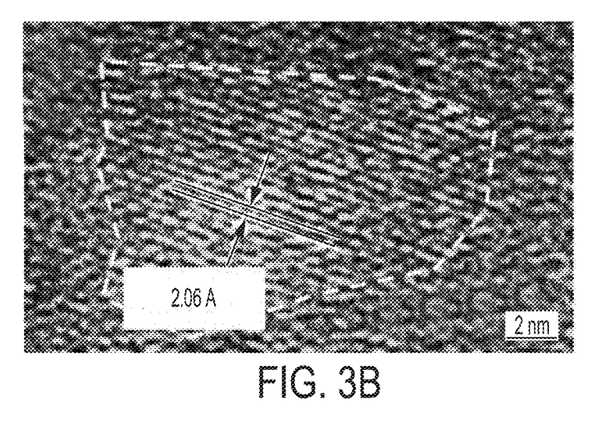
FIG. 3B is a TEM image of representative nanodiamond grown from paraffin with 2-Azaadamantane N-Oxyl (AZADO) seeds.
Figure 3C:
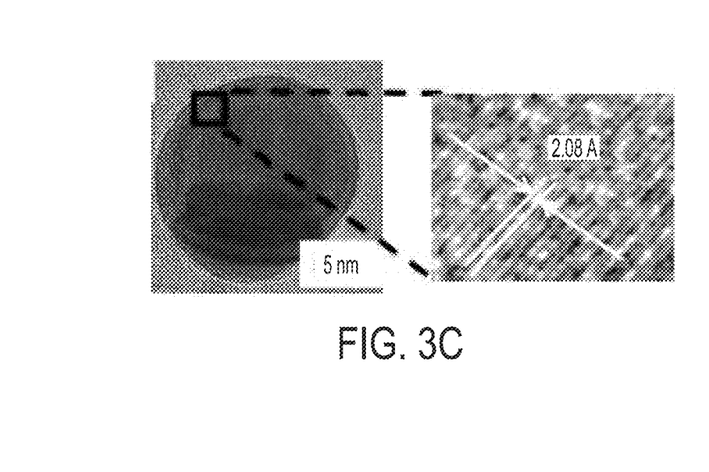
FIG. 3C is a TEM image of representative nanodiamond grown from heptamethylnonane with 1-adamantylamine seeds.

FIG. 3B is a HR-TEM image showing a 8 nm diamond grown at an even lower temperature than in pure adamantane. Diamonds ranging in size from a few nanometers up to 10's of nanometers were observed in this growth run. Paraffin was chosen as the reactive carbon source because it can be loaded in the DAC as a solid at room temperature and cracks at a relatively low temperature. During growth, FIG. 3A, only the paraffin C—H stretch could be seen in the Raman spectra and it eventually disappeared as the growth temperatures increased indicating that material was being consumed. At the highest growth temperature of approximately 635° C., a G-peak indicative of graphite was seen. When the product was removed from the DAC, a D-peak was also visible, which is associated with either amorphous carbon or small nanodiamonds. In addition to paraffin, diamond was grown from other organic molecules. In particular, FIG. 3C shows a large round diamond that was grown from heptamethylnonane seeded with 1-adamantylamine had a growth temperature of around 550° C. after an initial spike to 600° C. for 90 seconds.

Figure 3D:
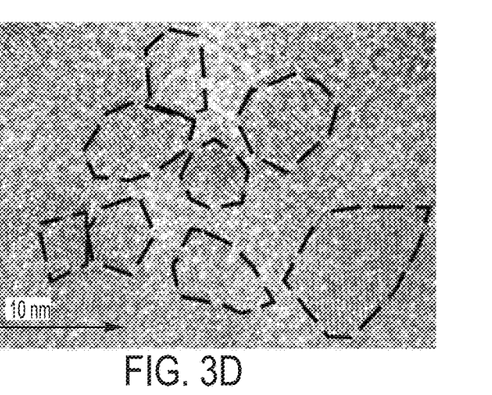
FIG. 3D is a TEM image of representative nanodiamonds grown from paraffin with 1-adamantylamine seeds for a long growth time of 24 hours.

FIG. 3D is a TEM image of nanodiamonds grown using a multi-anvil cell with paraffin wax as the reactive carbon source and 1-adamantylamine as the seed. The growth run was longer than all others (~24 hrs).

Figure 3E:
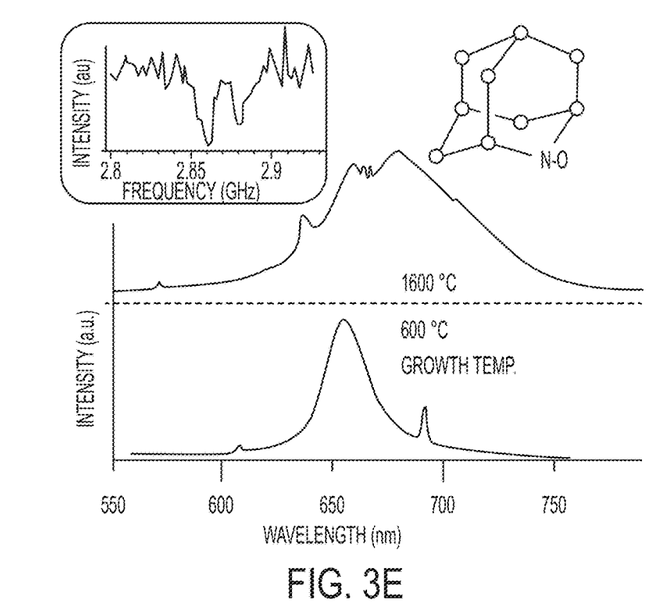
FIG. 3E shows comparison graphs of optical fluorescence from diamonds for 2-Azaadamantane N-Oxyl (AZADO) seeds growth above (top) and below (bottom) the decomposition temperature of the seed molecule. The high temperature growth gives nitrogen-vacancy (NV) centers even without post-irradiation as evidenced by the graph in the inset showing the optically detected magnetic resonance spectra (ODMR) of NV.

FIG. 3E is a graph of fluorescence spectra showing the effect of growth temperature on the fluorescent color centers produced during diamond growth. As seen, growth temperature (which controls growth rate) is found to strongly influence which diamond color centers are produced even for the same seed molecules in the growth mix. In the top trace of FIG. 3E a high temperature growth with a nitrogen (and oxygen) containing seed molecule, 2-Azaadamantane N-Oxyl (AZADO, Sigma-Aldrich), produced numerous nitrogen-vacancy (NV) centers after baking the product in air at 700 C. Notably, no irradiation was required to produce these NV centers implying that defects (vacancies) were incorporated into the diamond crystal during the rapid growth. However at lower growth temperature no NV is produced. Instead an unknown color center is observed (after 10 minutes baking in air at 530 C), as shown in the bottom trace of FIG. 3E. The fact that no NVs formed during low temperature growth, even though nitrogen was present in the seed molecule, means that defects like vacancies were excluded from the lattice. This may be interpreted as indirect evidence that slower growth produces higher quality diamond.

Figure 3F:
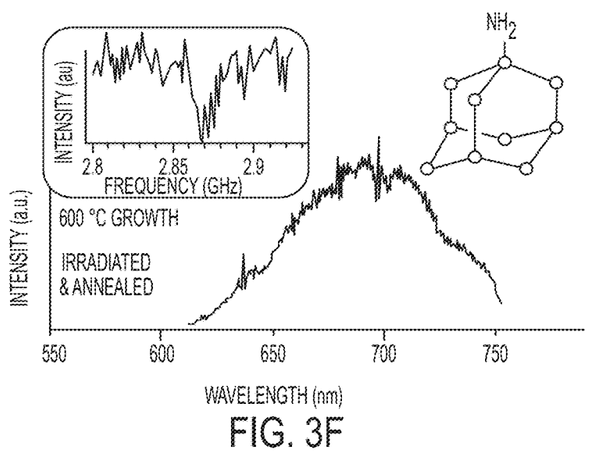
FIG. 3F shows graphs of nitrogen vacancy (NV) spectra in nanocrystals grown from optical fluorescence from diamonds grown with 1-adamantylamine seeds below the decomposition temperature of the seed molecule. To observe NV spectra the nanodiamonds had to be post-irradiated with electrons and then annealed in a vacuum at 700 C. Although the optical spectra is distorted, proof of NV is shown in the graph in the inset which shows the optically detected magnetic resonance spectra (ODMR) of NV. Compared to unseeded growth, this ODMR peak is not split, meaning that the crystal has lower strain.

To verify that nitrogen is in fact incorporated into the nanodiamonds during low temperature growth, post-irradiation was performed to produce NV centers, as illustrated in FIG. 3F. For this data the diamonds were grown from paraffin seeded with 1-adamantylamine (Sigma Aldrich). The growth was done at an even lower temperature (550 C) but for a longer time (90 min) than in the AZADO seeded runs. Again nanodiamonds of various sizes were found in the HR-TEM data, but initially no NV spectra. Subsequent electron irradiation of the nanodiamonds followed by vacuum annealing at 700 C for 2 hours did produce NV. The irradiation was performed in a JEOL 2010 TEM at an energy of 200 kV. The resulting emission spectrum in FIG. 3F is consistent with NV emission in nanocrystals. We also observed optically detected magnetic resonance (ODMR) in these nano-diamonds (inset of FIG. 3F) which is a signature of the NV center.

Figure 4:
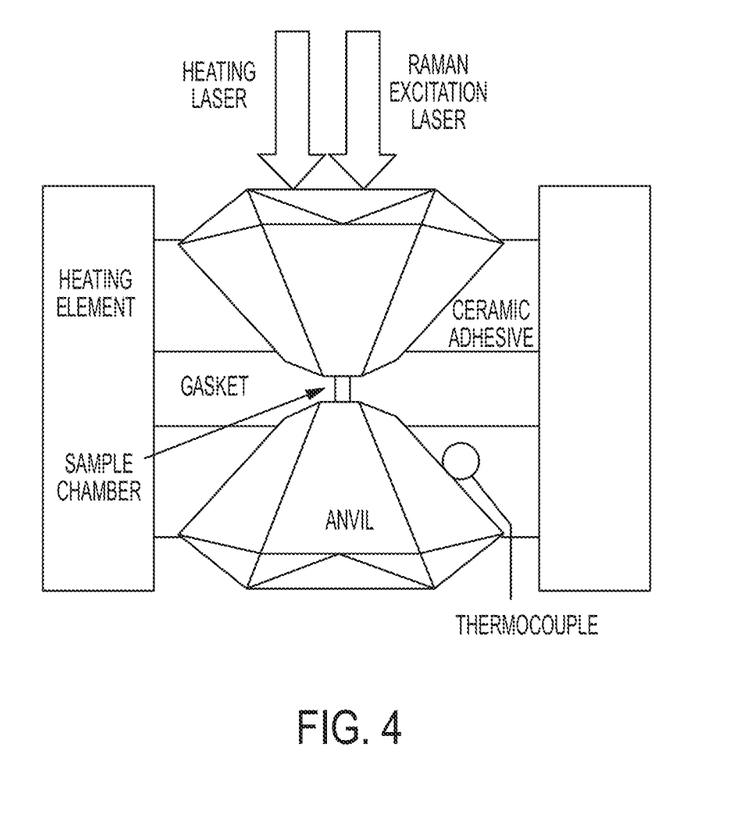
FIG. 4 is a schematic of a sample chamber of a diamond anvil cell (DAC)

FIG. 4 is a schematic of a sample chamber inside a DAC used in a resistance heating (furnace) method. In addition to using resistive heating, the sample inside the DAC can be locally heated to very high temperatures using a focused heating laser, as illustrated. A key advantage of the DAC is the ability to do real-time diagnostics during growth. For example, optical Raman spectroscopy of the reaction mixture can be monitored in real time.

Figure 5A:
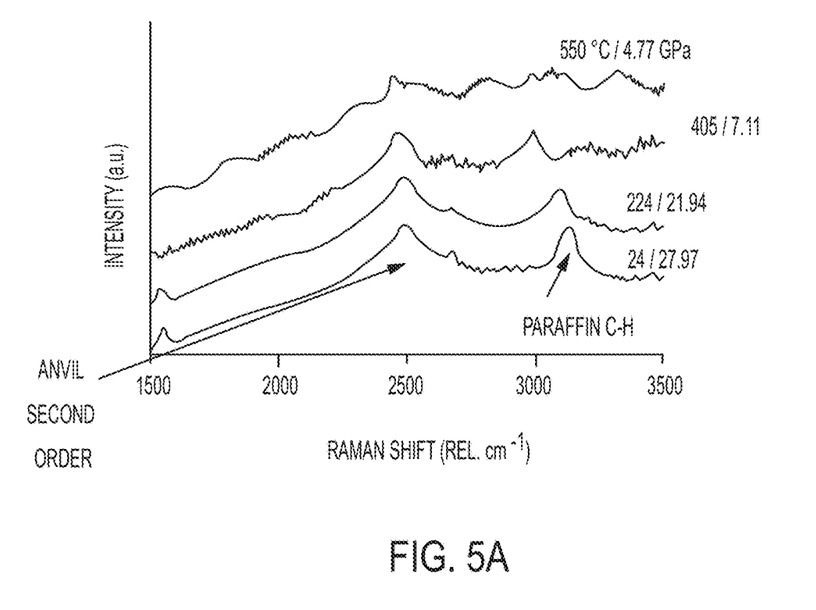
FIG. 5A a graph showing Raman spectra during diamond growth from paraffin alone, without any seed molecules.
Figure 5B:
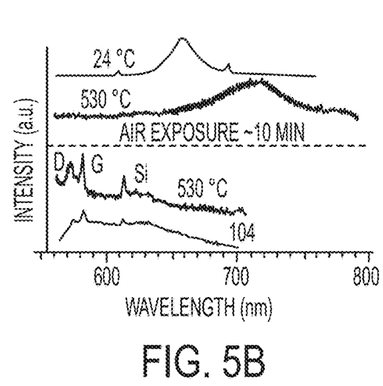
FIG. 5B is a graph showing intensity versus wavelength during post-growth baking.
Figure 5C:
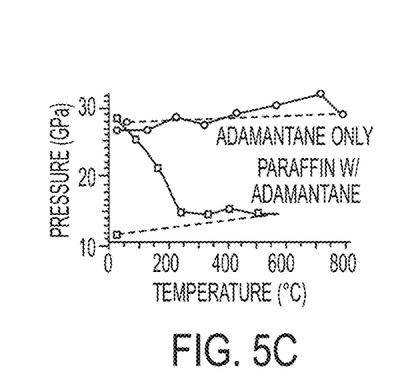
FIG. 5C is a graph showing growth pressure versus temperature for adamantane only and paraffin with adamantane.

FIG. 5C shows that for all paraffin growth runs the pressure begins dropping as soon as the mixture is heated. This suggests that the paraffin begins cracking at very low temperatures. Graphitic rods began growing from the metal gasket of the DAC as soon as the mixture is heated above ~100° C. When the graphitic rods stop growing the pressure stops decreasing, which suggests that a threshold has been reached. In contrast to the adamantane-only growth run of FIG. 2A, the pressure did not decrease significantly even though graphite rods grew.

Figure 6:
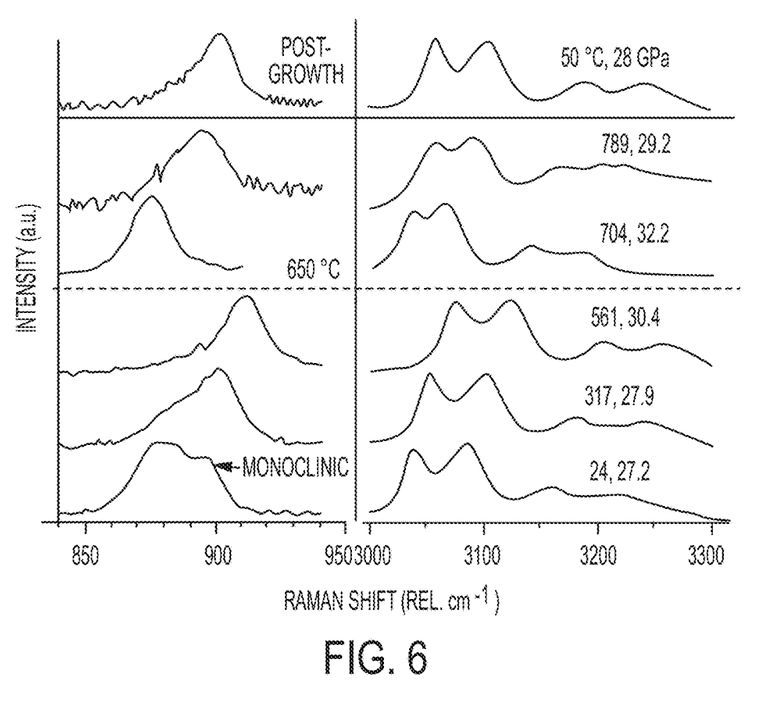
FIG. 6 is a graph showing adamantane Raman spectra during diamond growth.

FIGS. 6A and 6B illustrate the chemical stability of an organic seed molecule (adamantane) under conditions where diamond can grow. FIG. 6A shows Raman spectra during diamond growth using adamantane. Temperature and pressure are as indicated. As the temperature begins to increase both C—C and C—H stretch frequencies gradually increase by an amount that is consistent with the increasing pressure. The C—C band also shows the gradual transition from tetragonal to monoclinic phase which occurs in this pressure range. However, at 650° C. (horizontal dashed line), there is a sudden red-shift of both spectra along with an increase in pressure, possibly signaling a phase change. Further increases in temperature coincide with a drop in pressure suggesting that material is being consumed in a reaction. At the same time the Raman lines broaden but continue to shift toward smaller wavenumbers even though the pressure is now dropping. However, once the diamond growth run is completed and the temperature is allowed to return to ambient (post-growth), both bands return to peak positions and line widths are consistent with the Raman spectra of slightly heated adamantane (~317° C. trace) whose pressure matches the post-growth pressure. HR-TEM imagery of nanodiamonds produced in the adamantane-only growth run revealed that the dominant products were nanodiamonds in the range of 2-10 nm and carbon onions in the range of 10-50 nm.

In some embodiments of the invention, a method of producing fluorescent nanodiamonds includes seeded nanodiamond growth. The basic concept of seeded nanodiamond growth is illustrated in FIG. 1A. An organic seed molecule containing one or more diamond lattice units is synthesized chemically wherein the organic seed molecule has dopant atoms arranged in a geometry needed to form some color center of interest. For example, FIG. 1A shows aza-adamantane with a 13C carbon that could be a precursor for a nitrogen-vacancy quantum register. A source of reactive carbon (such as carbon radicals) is then added to the growth mix. Normally this is supplied by a hydrocarbon that "cracks" at a lower temperature than the diamond-like seed molecule. For example, FIG. 1A shows the addition of methyl and ethyl radicals that could be produced for example during cracking of a longer chain hydrocarbon. At low concentrations, the reactive carbon causes diamond to grow around the seed molecule. The growth of a diamond around the seed molecule creates a near-deterministic number and placement of the desired color center and also assures at least one fluorescent emitter per nanodiamond, no matter how small. In certain embodiments, seeded nanodiamond growth, unlike self-nucleation, allows for lower reactive carbon concentration, which yields higher quality nanodiamonds than self-nucleation growth.

Methyl and ethyl carbon radicals are shown in FIG. 1A because these are the dominant radicals present during chemical vapor deposition (CVD) growth. Here we note that a similar diamondoid seeding approach has been successfully applied to enhance nucleation of nanodiamonds for the growth of superior nanocrystal CVD diamond films. Other prior work has shown that isobutene molecules can also serve as a source of carbon radicals in the synthesis of larger diamondoids from smaller ones. A similar process is likely happening during the initial growth stage of the instant nanodiamonds. Here it is noted that carbon radicals may not actually be necessary in the future, as experiments have shown that halogenated organic compounds can grow diamond at a much lower temperature than normally required to produce a high enough radical concentration for self-nucleating radical-mediated growth. Ideally, the diamond growth process encapsulates the seed molecule so that it ends up near the center of the nanodiamond allowing near-deterministic creation and placement of the desired color center. A key point to note is that even a complex multi-atom color center can be produced by this technique with a high yield, even though such a center would be very rare in a diamond that relies on probabilistic co-location of the necessary atoms. Note also that the chemical composition of the encapsulating diamond can be very different from the seed molecule. This is important for color centers like the NV whose magnetic sensitivity is quickly degraded by the presence of other nitrogen atoms or other spin impurities in the diamond lattice. Similarly a quantum register consisting of a NV center optical-spin interface and a 13C storage nucleus placed at an optimum distance can be completely encapsulated by chemically and isotopically pure 12C diamond to give maximal storage times Compared to conventional self-nucleation from decomposed organic compounds, seeded nanodiamond growth provides better control over the subsequent diamond growth. Self-nucleation requires a relatively high reactive carbon (e.g., carbon radical) concentration, which leads to rapid subsequent growth which in turn tends to produce lower quality diamond with more defects. In contrast, when a seed crystal/molecule is present the radical (reactive carbon) concentration needed for diamond growth can be much lower, resulting in slower growth and therefore higher quality diamond. Other examples of advantages of slow growth are the deterministic orientation of NV centers and the successful n-type doping of diamond with phosphorous at growth rates of a few nanometer/minute.

FIG. 1B illustrates a conventional self-nucleation nanodiamond growth from decomposed organic precursors. For growth to occur, the concentration of carbon radicals must be high enough that multiple radicals spontaneously nucleate with a high probability. However, once nucleation has occurred, the high radical concentration leads to subsequent rapid growth, which tends to produce lower quality diamond compared to diamond made from organic-seed-molecule-based growth.

In some embodiments, the reactive carbon is supplied by a hydrocarbon that cracks at a lower temperature than the diamond-like seed molecules. In other embodiments, methane, isobutene, or other easily cracked hydrocarbons may function as the source of reactive carbon. Other embodiments of the invention may be directed towards a method of producing fluorescent nanodiamonds without the use of carbon radicals. In a further embodiment of the aforementioned method, halogenated organic compounds may be utilized to induce seeded growth at temperatures below that needed for radical creation.

Working Examples

Diamond Anvil Cells (DAC)

Precision diagnostics used to monitor nanodiamond growth were accomplished by using diamond anvil cells (DAC) as growth chambers. DACs have the advantage of being transparent so that optical Raman spectroscopy can be performed before, during, and after growth. In situ X-ray crystallography is also possible. The growth pressures that can be achieved with a DAC are the highest known so that the most extreme growth conditions can be studied. The DAC can also be heated up to 800° C. by resistive heating elements and well above 2,000° C. using laser heating (e.g., see FIG. 4). A disadvantage of a DAC is that the quantities of product are usually very small (e.g., ~50 microns$^3$). However, using the DAC it is often possible to optimize growth conditions so that much lower pressures (<10 GPa) can be used. In this case, larger HPHT presses can be used to scale up the DAC growth to kilogram quantities. A key advantage of the DAC is the ability to do real-time diagnostics during growth, for example optical Raman spectroscopy of the reaction mixture.

Two DAC designs were used in experiments: 1) a symmetric DAC and 2) a piston-cylinder DAC. The symmetric DAC was heated using a custom pyrophlite furnace with its heating wires covered in a high-temperature epoxy. The piston-cylinder DAC was heated using an oven. For the furnace heating method, the temperature was monitored by gluing a thermocouple onto one of the anvils, which yielded an undetermined error in the temperature measurement of the sample chamber. The thermocouple for the oven design was placed against the outside of the DAC. Note that although the thermocouple was not inside the DAC the temperature estimates are far more accurate for the oven because of the temperature uniformity inside the oven. For all resistive heating experiments, inert gas (98% Ar/2% $H_2$) was used to prevent oxidation of the DAC and heating coils. Rhenium was used for the gasket material for the symmetric DAC and Inconel was the gasket material for the piston-cylinder DAC. In all experiments, the pressure was monitored using the Ruby technique.

For all experiments, the initial diameter of the sample chamber was 100 μm with a depth of ~50 μm. The diamond anvil cullet size was 300 μm. All chemicals were purchased from Sigma-Aldrich. The adamantane was further purified to >99% by zone refinement for all the later experiments. The growth mixture for paraffin seeding experiments was created by melting the paraffin at 60° C. then adding the seed molecule and agitating until it was clearly dissolved in the wax. For the heptamethylnonane experiments the seed was added into the liquid and agitated until the seeds were completely dispersed. The sample was then placed into the sample chamber by hand using a tungsten needle or a micro-pipette. The mass ratio of the paraffin:AZADO seeding experiment was ~50:1 and that for paraffin:1-adamantylamine was ~13:1. It is estimated that if every diamondoid seed formed a nanodiamond, the average size would be ~2 nm if all the paraffin was consumed.

A walker-type multi-anvil press was used for the nanodiamond growth experiment pictured in FIG. 3D. The apparatus comprised a vertical hydraulic ram that applies thrust to a set of 6 pushing anvils contained within a cylindrical retaining ring. The pushing anvils form a central cubic cavity into which the 2nd-stage anvils and sample assembly are placed. The sample assembly is comprised of an octahedron cast from an MgO-based ceramic that contains a cylindrical graphite resistance heater, C-type thermocouple, alumina spacers and the encapsulated starting material. Pressure was applied to the faces of the octahedron via WC cubes with truncated corners (the 2nd-stage anvils). Sample pressure was determined as a function of oil pressure using a fixed-point calibration curve. Starting materials were encapsulated using either crushable MgO pieces or graphite.

Comparison of Diamondoid Seeded and Unseeded Growth Runs

Having established in earlier growth runs that nanodiamonds can grow under conditions where diamondoid seed molecules remain stable, the next step is to grow diamonds from a mixture of diamond-like seeds and an easily cracked source of reactive carbon (e.g., radicals). This is demonstrated in FIGS. 3A-3F using paraffin (Sigma-Aldrich) or heptamethylnonane as a source of radicals and adamantane or 1-adamantylamine or 2-Azaadamantane N-Oxyl (AZADO) as seed molecules. Paraffin was chosen as a radical (reactive carbon) source because it can be loaded in the DAC as a solid at room temperature, and is a mix of alkanes of different lengths. It was not clear in advance what would be the optimum choice for chain length.

As seen in FIG. 3A the paraffin C—H stretch, which was the only Raman line visible for paraffin, is reduced in amplitude as the growth temperature is increased indicating that material is being consumed, and disappears when the G-peak begins to appear. At the highest growth temperature a G-peak indicative of nanocrystal graphite is clearly seen, and, when the product is removed from the DAC, an amorphous carbon (and possibly nanodiamond) D-peak is also clearly visible. The top spectrum is post-growth, taken after the sample has been extracted from the anvil cell so that the D-peak is no longer obscured by the anvil. Significantly, control experiments involving growth from paraffin with and without diamondoid seeds show that no D or G peaks are observed without seed molecules below 600° C. growth temperatures. In fact no solid product (except the graphitic rods) is observed at all after anneal unless diamondoid seeds are present in the growth mixture. The pressure begins dropping as soon as the mixture is heated which suggests that the paraffin is being consumed. TEM imaging showed graphitic rods growing out from the metal gasket as soon as the mixture was heated above ~100° C. These are observed in all growth runs with Inconel gaskets since this metal catalyzes graphite formation. However, these are not nanoparticles and can be easily separated from the other growth products.

Further proof that nanodiamonds were grown by diamondoid-seeded paraffin was established via transmission electron microscope (TEM) imaging. Nanocrystal graphite was also found in the TEM imaging. The TEM imaging also showed that the product consisted of both black and white colored regions. Based on prior reports, the white region is where high quality nanodiamonds are expected. However, it was not possible to keep the colors separated during preparation of the TEM grid. Diamonds ranging in size from a few nanometers up to 10's of nanometers were observed in this and similar growth runs.

Simply showing that nanodiamonds can be grown from a mix of paraffin and diamondoid seed molecules is not sufficient to prove that seeded growth is taking place. It must also be established that diamonds do not grow directly from the paraffin via self-nucleation under similar conditions. This was verified by attempting to grow diamonds directly from paraffin without any diamondoid seeds. The results are shown in FIG. 5A. Not only were nanodiamonds not produced without diamondoid seed molecules, but no solid product remained after baking in air above 530° C. (except for large ruby and graphite crystals). In contrast, with diamondoid seeds (see FIG. 5B) exposure to air at 530° C. was needed to activate nanodiamond fluorescence.

For the diamondoid seeded case the same high-temperature air baking activates a diamond color center as shown in FIG. 5B. HR-TEM data provided independent verification for the presence of diamond only in the diamondoid seeded case. Paraffin-only growth runs were made at temperatures up to 620° C. In all paraffin growth runs with an Inconel gasket graphite rods grew from the gasket. This is consistent with the gasket metal catalyzing graphite formation. The growth of these rods was accompanied by a decrease in pressure until reaching a threshold level at which time the graphite rods ceased growing, as shown in FIG. 5C.

As seen in FIG. 3E, growth temperature is found to strongly influence which diamond color centers are produced even for the same dopant molecules in the growth mix. In the top trace a high temperature growth with a nitrogen (and oxygen) containing seed molecule, 2-Azaadamantane N-Oxyl (AZADO, Sigma-Aldrich), produced clear nitrogen-vacancy (NV) centers after baking the product in air above 600° C. Similarly high temperature growth in the presence of silicon doping produced silicon-vacancies (SiV). However, at lower growth temperature neither NV nor SiV are produced, even though both the AZADO and organo-silicon compounds are present in the growth mix. Instead, an unknown color center is observed (after 10 minutes baking in air at 530° C.), as shown in the bottom trace of FIG. 3E. Since slow growth of high-quality diamond around the seed molecule would tend to exclude atoms other than carbon, these observations are consistent with our hypothesis that seeded growth should produce high purity diamonds with the only impurity being those present in the seed molecule.

To produce NV color centers by seeded growth, oxygen was removed from the seed molecule by replacing AZADO with Adamantylamine (Sigma Aldrich). In addition, an attempt was made to reduce the number of non-diamond particles by growing at a lower temperature but for a longer time (e.g., 550° C. for 90 minutes) than in the AZADO runs. Again nanodiamonds of various sizes were found in the HR-TEM data. A larger nanodiamond with a good morphology was shown in HR-TEM image of FIG. 3C. This diamond was a single crystal and round in shape with no visible graphite shell. At first, no color centers were found in the product of this growth run. However, after electron irradiation (in a TEM) and high temperature vacuum annealing at 700° C. for 2 hours, strong fluorescence emission was observed as seen in FIG. 3F. This emission spectrum is consistent with NV emission in crushed HPHT nanocrystals.

Thus, it was demonstrated that a radical departure from conventional nanodiamond growth promises to give an unprecedented level of control over nanodiamond properties and color centers therein, especially for ultra-small nanodiamonds. This has numerous potential applications ranging from ultra-small non-bleaching fluorescent biological probes (down to sizes smaller than dye molecules), to nanoscale NV-based sensors of magnetic and electric fields and temperature, to precisely engineered quantum registers with deterministic placement of nuclear storage qubits and NV optical interface qubits.

In the future larger and more complex diamond-like seeds will need to be synthesized to take full advantage of this technique. It is also necessary to optimize the size distribution of the nanodiamonds, as well as the fraction of seed molecules that produce diamonds, as opposed to other forms of carbon. One way to accomplish this is to replace the paraffin with molecules that can potentially grow diamond at a lower temperature, for example methane or other short-chain hydrocarbon. In addition, halogenated carbon has been shown to reduce diamond growth temperature in HPHT. It may even be possible to allow complete diamond lattice units to be added in a single step, for example with isobutane.

Lastly, the possibility of future scaling was addressed to multi-kilogram quantities via large industrial presses of the type currently used to grow bulk HPHT diamond. To this end, it was noted that in the seeded paraffin growth run presented in the lower trace of FIG. 3D was grown in a multi-anvil press at the Carnegie Institution of Washington at a pressure of 15 GPa and 600° C. for 30 minutes. The resulting ~0.5 µl volume of nanodiamond-containing product had similar color centers to those produced by diamond anvil growth (see FIG. 5E). It was noted that in some of our diamond anvil experiments pressures well below 5 GPa were found to produce diamonds, and such pressures are achievable in some large industrial presses.

Table 1 below gives the main experimental parameters for a set of 4 different seeding experiments using the Paraffin wax and either Adamantane or Diamantane as the diamondoid seed. As already mentioned, both seeds were purified to at least 99% and the ratio of $C_{32}H_{64}$ (a typical hydrocarbon found in paraffin wax) to Adamantane or Diamantane was about 50:1. For all experiments, broad band luminescence (BBL) (for example see FIG. 3A at 630° C.) was seen at temperatures above $T_R$ in Table 1, where $T_R$ depended on the seed molecule (~600° C. for Adamantane and 670° C. for the Diamantane) as shown in Table 1. This BBL was very bright and saturated the spectrometer for the 1 second accumulation time used. After the BBL subsided, but with the temperature still above $T_R$, the Raman spectrum exhibits G-peaks, as well as a new peak around 3200 rel. cm$^{-1}$ (for example see FIG. 3A at 635° C.). The D-peak is not visible when the sample is inside of the DAC because of the Diamond anvil Raman line. However, it becomes visible when the product is removed from the DAC (for example see FIG. 3A "post-growth").

TABLE 1

Data for the seeding experiments conducted with Paraffin wax as the Carbon radical source.

| Name | Seed | $P_o/P_f$(GPa) | $T_R$(° C.) | $\Delta t$(min.) |
|---|---|---|---|---|
| Para6 | Adamantane | 32/4.6 | 600 | <1 |
| Para7 | Adamantane | 32/9.6 | 600 | 10 |
| Para8 | Adamantane | 10/3.6 | 600 | 10 |
| Para9 | Diamantane | 42/3.6 | 670 | 15 |

The initial pressure is $P_o$ and the final pressure is $P_f$ which is measured before bright luminescence. $T_R$ is the temperature above which visible signs of the growth process were observed, but this does not imply that growth is not occurring below $T_R$. $\Delta t$ is the amount of time the sample was kept above the temperature $T_R$. Note that for all experiments the gasket material was Inconel except for para7, which used Rh. There are two important observations that can be made from Table 1. The first is that the final pressure is much higher when the Rh gasket is used instead of Inconel. This is believed to be related to the fact that the graphitic rods did not grow on the Rh gasket. Second, the temperature at which growth is believed to have initiated, $T_R$, depends on whether the seed was adamantane or diamantane. This suggests that growth (or at least the bright luminescence) is associated with a change in the diamondoid seed molecule, for example the onset of dehydrogenation which might accelerate bonding of the carbon radicals to the seed molecules.

Comparison of Diamondoid Seeded and Unseeded Growth Runs

As stated in the main text, the hypothesis of diamondoid seeding is only confirmed if no nanodiamonds are formed in the absence of seed molecules. This is verified in FIGS. 5A and 5B, which compare two growth runs, one with and one without diamondoid seeds, respectively. Specifically, FIG. 5A depicts the Raman spectra obtained for a paraffin-only growth run. Temperatures and pressures are as indicated. Note that the paraffin C—H stretch decreases in amplitude with increasing temperature as for the seeded growth. However, without the diamondoid seed molecules no solid product remains after baking the product in air above 530° C. (except for large ruby and graphite crystals). At higher growth temperatures above 600° C., pure paraffin does show D and G peaks, but no diamonds are found, as verified by air anneal and TEM images (not shown). This proves that the seed molecules are essential for growing nanodiamond. For the diamondoid seeded case the same high-temperature air baking activates a diamond color center as shown in FIG. 5B.

In all paraffin growth runs with an Inconel gasket, graphite rods grew from the gasket, as seen in the inset of see FIG. 5C. This is consistent with the gasket metal catalyzing graphite formation. The growth of these rods was accompanied by a decrease in pressure until reaching a threshold level at which time the graphite rods ceased growing, as shown in FIG. 5C. In contrast there was no pressure decrease in the adamantane-only growth run even though graphite rods formed in this case too.

Adamantane-Only Growth Run

To prove the feasibility of molecule-seeded nanodiamond growth it is first necessary to demonstrate that diamond can be grown under conditions where the organic seed molecules do not appreciably decompose. This is most easily done by growing diamond directly from adamantane (Sigma-Aldrich, >99%, purified by zone refinement) as shown in FIG. 2A and FIG. 6. As adamantane is the only molecule present, some decomposition is needed to produce enough radicals for diamonds to grow but this should be small enough so as not to cause significant distortion of the Raman spectrum of the starting material. As discussed above, FIG. 2A and FIG. 6 show the Raman spectra of C—C and C—H stretch regions of adamantane during two different nanodiamond growth runs in a DAC. Temperature and pressure were as indicated. As the temperature increased, both the C—C and C—H stretch frequencies gradually decrease by an amount that is consistent with the decreasing pressure. Above 410° C. (horizontal dashed line) there was a rapid red-shift of both spectra which suggests that the adamantane has undergone a transformation. However, once the growth run is completed and the temperature and pressure are restored to their initial values, both bands return to their initial positions and line widths (post-growth spectra above solid line). More details of the benefits and tradeoffs of a DAC are discussed in relation to FIG. 4. Note that the loss in pressure during growth in the oven design can be attributed to relaxation of the DAC structure which does not occur in the furnace design, or to the fact that the furnace design was implemented with Re gaskets which do not catalyze graphite and therefore consume less adamantane. After growth the pressure in the DAC was increased to its initial value and the resulting Raman spectra appear identical to the initial ones, thus verifying that no significant decomposition of the adamantane occurred.

Although there are changes in the spectra during growth, they return to their initial positions and line shapes after restoring the post-growth mixture to its initial temperature and pressure, thereby proving that no significant decomposition occurred. Note that this spectra does not rule out some conversion to higher diamondoids and in fact this is likely to have occurred in order for the nanodiamonds to grow. For comparison, FIG. 2B shows clear evidence of decomposition at a higher growth temperature using laser heating. Here, the C—H stretch, which is the most sensitive measure of decomposition, significantly distorts during growth and in fact this distortion is accompanied by visible white flashes. Unfortunately, the actual temperature could not be measured by the thermal imaging apparatus because it was below the minimum detectable temperature of 1,200° C.

Evidence that nanodiamonds can be grown at such low temperatures (below 660° C. in FIG. 2A) was confirmed via TEM imaging, which showed nanodiamonds isolated from the reaction products of another adamantane-only run described by FIG. 6. The diamond size range was 2-10 nm where it should be noted that smaller diamonds might also be present but cannot be seen through the background speckle pattern. In agreement with prior nanodiamond growth at higher temperatures, other forms of nanocarbon were also found, in this case carbon onions larger than 10 nm.

The TEM photos of nanodiamond were taken from the product of an earlier adamantane-only growth run. This growth was performed using the DAC furnace described relative to FIG. 4, which underestimated the growth temperature by ~200° C. The data from this earlier growth run is shown in FIG. 6, wherein FIG. 6 depicts earlier adamantane-only growth run that produced the nanodiamonds in the TEM photos. As before, no significant adamantane decomposition is observed. Raman spectra were taken during growth at the temperatures and pressures indicated. Note that the growth temperature is over-estimated as a result of details of the oven design shown in FIG. 4. Comparing these Raman spectra with those of FIG. 2A shows that the transition region (dashed line) occurs ~200° C. lower when the entire DAC is heated and hence this gives the approximate temperature correction. As the temperature begins to increase both the C—C and C—H stretch frequencies gradually increase by an amount that is consistent with the increasing pressure. The C—C band also shows the gradual transition from tetragonal to monoclinic phase which occurs in this pressure range. However, at 650° C. (horizontal dashed line) there is a sudden red-shift of both spectra along with an increase in pressure. Further increases in temperature coincide with a drop in pressure suggesting that material is being consumed in a reaction. At the same time, the Raman lines broaden but continue to red-shift even though the pressure is now dropping, which suggests that the adamantane has undergone a transformation. However, once the diamond growth run is completed and the temperature allowed to return to ambient (post-growth), both bands return to peak positions and line widths that are consistent with the original adamantane spectra at the post-growth pressure. The adamantane transition at 650° C. is similar to the one occurring at ~450° C. in FIG. 2A, and it was this difference that was used to estimate the temperature error for the furnace. Note the "post-growth" Raman spectrum looks the same as that at 317° C. where the pressures are the same Since the changes in adamantane spectra below 561° C. could be accounted solely by the pressure difference, this verified that no significant decomposition of the adamantane occurred. In FIG. 2A the DAC was re-pressurized to its initial value so the "post-growth" comparison was more exact.

Effect of Growth Temperature

The effect of growth temperature on the fluorescent color centers produced during diamond growth is shown in FIG. 3E. As seen, growth temperature (which controls growth rate) is found to strongly influence which diamond color centers are produced even for the same dopant molecules in the growth mix. In the top trace of FIG. 3E, a high temperature growth with a nitrogen (and oxygen) containing seed molecule, 2-Azaadamantane N-Oxyl (AZADO, Sigma-Aldrich), produced numerous nitrogen-vacancy (NV) centers after baking the product in air at 700° C. Notably, no irradiation was required to produce these NV centers implying that defects (vacancies) were incorporated into the diamond crystal during the rapid growth. However at lower growth temperature no NV is produced. Instead, an unknown color center is observed (after 10 minutes baking in air at 530° C.), as shown in the bottom trace of FIG. 3E. The fact that no NVs formed during low temperature growth, even though nitrogen was present in the seed molecule, means that defects like vacancies were excluded from the lattice. This may be interpreted as indirect evidence that slower growth produces higher quality diamond.

To verify that nitrogen was in fact incorporated into the nanodiamonds during low temperature growth, post-irradiation was performed to produce NV centers as illustrated in FIG. 3F. For this data the diamonds were grown from paraffin seeded with 1-adamantylamine (Sigma Aldrich). The growth was done at an even lower temperature (550° C.) but for a longer time (90 minutes) than in the AZADO seeded runs. Again, nanodiamonds of various sizes were found in the HR-TEM data, but initially no NV spectra. Subsequent electron irradiation of the nanodiamonds followed by vacuum annealing at 700° C. for 2 hours did produce NV. The irradiation was performed in a JEOL 2010 TEM at an energy of 200 kV. The resulting emission spectrum in FIG. 3F was consistent with NV emission in nanocrystals. Optically detected magnetic resonance (ODMR) was also detected in these nano-diamonds, which is a signature of the NV center.

A control experiment was performed using paraffin without diamondoid seed molecules. In this case, no solid product remained after baking in air above 530° C. for 10 minutes, which was the temperature needed to activate nanodiamond fluorescence in the case of nitrogen-doped diamondoid seeds. To test the feasibility of "scaling up" the process, nanodiamonds were grown inside a multi-anvil press for 24 hours at 8 GPa and 560° C. The reactive carbon source was paraffin wax and the seed was 1-adamantylamine. Nanodiamonds with a size range of 5 to 100 nm were seen and the electron diffraction pattern (not shown) included the characteristic diamond (111) reflection. Nitrogen vacancies were also observed after irradiation (not shown).

In conclusion, it was demonstrated that diamond can be grown under conditions were organic seed molecules are stable. This is a key requirement for future growth of seeded nanodiamonds. No diamonds were found in control experiments without seed molecules present. The molecule-seeded approach to nanodiamond growth promises to give an unprecedented level of control over nanodiamond properties and color centers therein. This has numerous potential applications ranging from ultra-small non-bleaching fluorescent biological probes (down to sizes smaller than dye molecules), to nanoscale NV-based sensors of magnetic and electric fields and temperature, to precisely engineered quantum registers with deterministic placement of nuclear storage qubits and NV optical interface qubits.

Future work mainly centers on demonstrating and optimizing the seeding process. One way to establish seeded growth is to grow nanodiamonds with a deterministic number of fluorescent centers like NV, or SiV. Another way is to use a different isotopic composition for seed and growth medium, for example a 13C seed doped with nitrogen and natural abundance paraffin. In this case, the NV color centers produced would have a distinct 13C signature if the seeding were successful. Optimization of the seeding process primarily consists of enhancing the fraction of diamondoid seeds that produce nanodiamonds. One approach is to identify catalysts, for example halogenated carbon was shown to catalyze diamond growth in prior work.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, the processes described herein can be embodied within a form that does not provide all of the features and benefits set forth herein, as some features can be used or practiced separately from others. The scope of protection is defined by the appended claims rather than by the foregoing description. All changes which come within the meaning and range of equivalency of the claims are to be embraced within their scope.

What is claimed is:

1. A composition for forming a nanodiamond, the composition comprising:
   a mixture of at least one organic seed molecule, wherein the organic seed molecule is selected from the groups consisting of adamantane, 1-adamantylamine and 2-azaadamantane N-oxyl; and
   an organic compound having a decomposition temperature that is lower than the decomposition temperature of the organic seed molecule, wherein the organic compound is selected from the group consisting of paraffin and heptamethylnonane.

2. The composition of claim 1, wherein the organic seed molecule has been chemically modified.

3. The composition of claim 1, wherein the organic seed molecule has a purity of greater than 99%.

4. The composition of claim 1, wherein the nanodiamond formed by the composition comprises a round shape with no visible graphite shell.

5. The composition of claim 1, wherein the organic seed molecule comprises dopant atoms arranged in a first geometry to obtain a first color dependent upon the first geometry.

6. The composition of claim 1, wherein the ratio of 2-azaadamantane N-oxyl to paraffin is around 1:50.

7. The composition of claim 1, wherein the ratio of 1-adamantylamine to paraffin is around 1:13.

* * * * *